United States Patent [19]

Kovalchick et al.

[11] Patent Number: 4,731,663

[45] Date of Patent: Mar. 15, 1988

[54] METHOD AND APPARATUS FOR COLOR IDENTIFICATION

[75] Inventors: Joseph S. Kovalchick, Middlesex; Theodore J. Sikorski, Trenton; Ralph A. Treder, Ewing, all of N.J.

[73] Assignee: American Telephone and Telegraph, New York, N.Y.

[21] Appl. No.: 52,101

[22] Filed: May 20, 1987

[51] Int. Cl.⁴ .............................................. H04N 7/18
[52] U.S. Cl. .................................. 358/101; 358/106; 382/8; 382/17
[58] Field of Search ............... 358/101, 106; 356/394, 356/402, 405, 406, 416, 425; 382/8, 17; 379/25

[56] References Cited

U.S. PATENT DOCUMENTS

| | | | |
|---|---|---|---|
| 1,837,365 | 12/1931 | Ives . | |
| 2,675,488 | 4/1954 | Bickley | 250/209 |
| 2,823,800 | 2/1958 | Bliss | 209/111 |
| 2,827,594 | 3/1958 | Rabinow | 315/83 |
| 2,982,408 | 5/1961 | Blackburn et al. | 209/111 |
| 2,988,219 | 6/1961 | Bartlett | 209/111 |
| 3,012,666 | 12/1961 | Cox | 209/111.5 |
| 4,004,176 | 1/1977 | Otake | 358/44 |
| 4,166,280 | 8/1979 | Poole | 358/50 |
| 4,278,538 | 7/1981 | Lawrence et al. | 209/580 |
| 4,343,553 | 8/1982 | Nakagawa et al. | 356/376 |
| 4,390,895 | 6/1983 | Sato | 358/44 |
| 4,462,045 | 7/1984 | Norris | 358/93 |
| 4,591,899 | 5/1986 | Hashimoto | 358/41 |
| 4,636,847 | 1/1987 | Magi | 358/101 |

OTHER PUBLICATIONS

Heinz; Alfred, "Electro-Optics A New Manufacturing Tool," *Western Electric Engineer*, Apr. 1964.
Lieberman; David, "Liquid Crystal Displays Take a New Twist, *Electronic Products*, Aug. 15, 1986.

*Primary Examiner*—Howard W. Britton
*Attorney, Agent, or Firm*—Robert B. Levy

[57] ABSTRACT

The color of each of a plurality of wires 18(1) ... 18(8) can be determined by first placing the wires proximate to a white background (31) and then directing a pair of light beams (36,38) thereat. Each of the red, green and blue spectral components in the light reflected from each wire and in the light reflected from the surface is simultaneously sensed by a separate one of three television cameras (40,42 and 44), respectively, having a separate one of a set of red, green and blue band pass filters (52,54 and 56), respectively, thereon. The output signal of the television cameras is processed by a machine vision system (58) which first computes the ratios of the red, green and blue spectral components of the light reflected from each wire to the red, green and blue spectral components, respectively, of the light reflected from the background. Each of the red, green and blue intensity ratios computed for each wire is then compared by the machine vision system to a red, green and blue intensity ratio, respectively, established for each of a plurality of wires of known colors until a substantial match therebetween is found. When a substantial match is found, the wire of unknown color can then be identified.

12 Claims, 5 Drawing Figures

METHOD AND APPARATUS FOR COLOR IDENTIFICATION

FIELD OF THE INVENTION

This invention relates to a method and apparatus for identifying the color of an object.

BACKGROUND OF THE INVENTION

Many industrial processes require, as an integral step thereof, the identification of the color of one or more objects. One such example is the process of connecting a color-coded wire to a matching contact of a multi-contact electrical connector. While accurate color identification is essential if the proper wire is to be matched to the corresponding contact, manual color identification has often yielded inaccuracies due to operator boredom and eyestrain as well as difficulties in distinguishing small differences in hue.

An example of a proposal to automate color identification is disclosed in U.S. Pat. No. 4,278,538, issued July 14, 1981, in the name of H. S. Lawrence et al. and assigned to Western Electric Co. The Lawrence et al. system includes three photodetectors positioned to sense the intensity of the light reflected from an illuminated object, the color of which is to be identified. Filters are provided on each of a pair of photodetectors to make each of them sensitive to a separate one of two primary colors. The third photodetector is filtered so as to be sensitive to a color, which, when added to each of two primary ones, effectively synthesizes the third primary color. The output signals of the photodetectors are processed by a microprocessor to obtain a set of three values, each representative of the intensity of one of the three primary colors in the light reflected from the object. These intensity values are compared to separate sets of standard intensity values, each associated with a separate known color. When a substantial match is found between each of the three actual intensity values and the three intensity values of one standard set associated with a known color, then the color of the object will be known.

In order for Lawrence et al. to achieve repeatable, accurate color identification of an object, the color spectra of the lamp illuminating the object must be kept substantially constant. To this end, Lawrence et al. provide a feedback system for controlling the excitation of the lamp in accordance with the color spectra thereof. However, adjusting the excitation of the lamp to control its color will not compensate for variations in the output signal of each photodetector, which may be caused by the aging thereof or the presence of dirt on the filter in front of the detector. Such variations in the output signal of the detector may sometimes lead to erroneous color identification.

SUMMARY OF THE INVENTION

The foregoing problem is significantly alleviated by the instant identification method which is initiated by placing the object against a background whose color (typically white) is selected so as to be uniquely distinguishable from the possible colors of the object. The object and the background are both illuminated and the intensity of light reflected both from the object and the background are sensed. The ratio of the intensity of each of a plurality of spectral components in the light reflected from the object to the intensity of the corresponding spectral component in the light reflected from the background is then computed. The ratios are each compared to each of a set of reference intensity ratios established for each of a plurality of reference bodies of different known colors. When a substantial match is found between each of the computed ratios and each of the reference intensity ratios, then the color of the object can be ascertained.

The advantage afforded the instant color identification technique is that the ratio of the intensity of each of the spectral components in the light reflected from the object to the corresponding spectral component in the light reflected from the background remains substantially constant. This is true, notwithstanding variations in the intensity of each spectral component as sensed by a detector. As a result, aging of the detector or dust thereon does not significantly affect the accuracy of color identification. Moreover, the need for a feedback system to control the illumination of the object is avoided.

DETAILED DESCRIPTION

Figure 1:
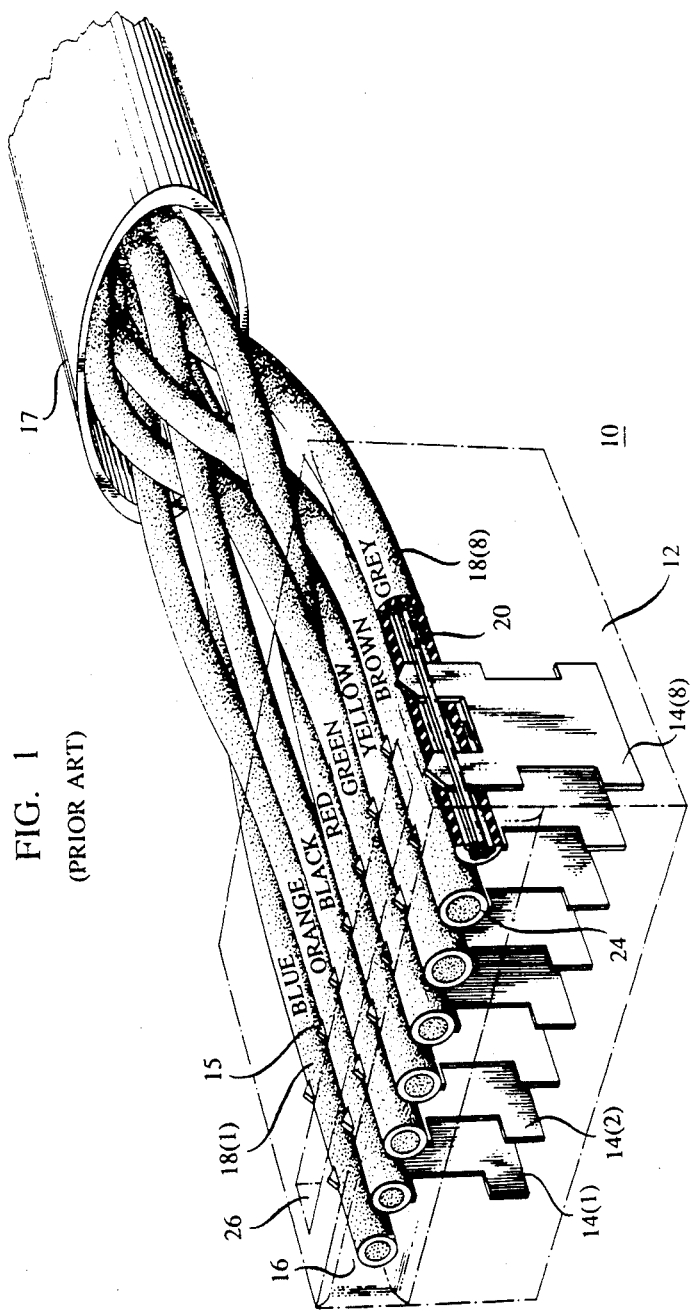
FIG. 1 is a perspective view of an electrical connector having a plurality of contacts, each connected to an individual wire of a multi-conductor cable.

FIG. 1 is a perspective view of a prior art electrical connector 10 comprised of an insulative body 12 (e.g., plastic) which contains a plurality of spaced electrical contacts 14(1) . . . 14(8) therein, each having a portion which is exposed through the body. Each of the contacts 14(1) . . . 14(8) has a pair of spikes 15 thereon which extend upwardly therefrom into a cavity 16 in the body 12. The cavity 16 communicates with an opening (not shown) in the end of the body 12 which is sized to receive an end of a cable 17 containing a set of wires 18(1) . . . 18(8). Each of the wires 18(1) . . 18(8) consists of one or more metal conductors 20 (e.g., copper) sheathed in an insulative jacket 24 (e.g., plastic). In order to distinguish the wires 18(1) . . . 18(8) from each other, the insulative jacket 24 of each wire is made a different color. The color of the jacket 24 of each of the wires 18(1) . . . 18(8) is listed in Table I.

TABLE I

| Wire No. | Color of Jacket 24 |
| --- | --- |
| 18(1) | blue |
| 18(2) | orange |
| 18(3) | black |
| 18(4) | red |
| 18(5) | green |
| 18(6) | yellow |
| 18(7) | brown |
| 18(8) | grey |

In order to connect each of the wires 18(1) . . . 18(8) to a corresponding one of the contacts 14(1) . . . 14(8), respectively, the end of the cable 17 is first stripped of its insulation to expose a length of the wires. Thereafter, the exposed wires 18(1) . . . 18(8) are combed out and then ordered (i.e., arranged) in the same spatial relationship as the contacts 14(1) . . . 14(8) to which they are to be connected. The stripped end of the cable 17 is then inserted into the opening in the end of the connector body 12 so that each of the exposed wires 18(1) . . . 18(8) enters the cavity 16 and becomes contiguous with the spikes 15 on a separate one of the contacts 14(1) . . . 14(8). A ram (not shown) is then inserted through an opening 26 in the top of the body 12 in communication with the cavity 16 to press against the wires 18(1) . . . 18(8) so the jacket 24 of each of the wires is pierced by the spike 15 on each of the contacts 14(1) . . . 14(8), respectively.

Before the exposed wires 18(1) . . . 18(8) can be arranged the same as the contacts 14(1) . . . 14(8) to which each is to be connected, it is necessary to know the initial order of the wires after they have been combed out following stripping of the cable 17. The initial order of the exposed wires 18(1) . . . 18(8) is given by the sequence of the colors of the jackets 24 thereof. Thus, by knowing the color of the jacket 24 of each of the exposed wires 18(1) . . . 18(8), the order of the wires can be ascertained.

Figure 2:
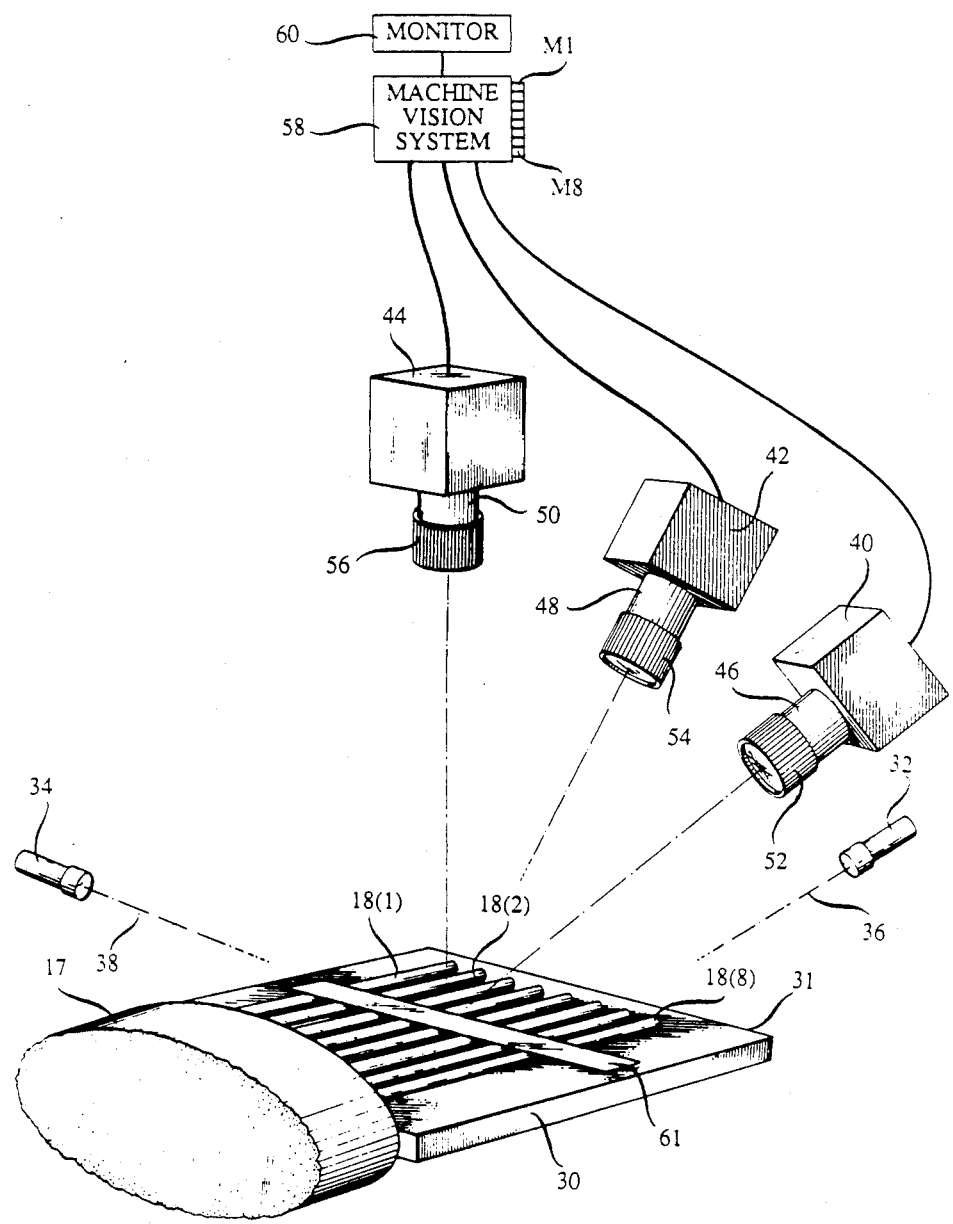
FIG. 2 is a perspective view of an apparatus for identifying the color of each wire in the cable of FIG. 1.

FIG. 2 is a schematic view of a system 28, constructed in accordance with the present invention, for accurately identifying the color of the jacket 24 (see FIG. 1) of each of the wires 18(1) . . . 18(8) exposed upon stripping the end of the cable 17. The apparatus 28 comprises a substrate 30 having a major surface 31 which serves as a background proximate to which the exposed wires 18(1) . . . 18(8) are placed. The surface 31 is made a neutral color, that is, one which is uniquely distinguishable from the wire colors to be identified. In an exemplary embodiment, the surface 31 is made white, since that color is not among the wire colors to be identified and thus, can be uniquely distinguished therefrom.

A pair of lamps 32 and 34 illuminate the surface 31 and the wires 18(1) . . . 18(8) placed proximate thereto by directing each of a pair of light beams 36 and 38, respectively, thereat from opposite directions. In practice, the lamps 32 and 34 are each chosen to be fluorescent rather than incandescent because fluorescent lamps are much less prone to color drift, thereby insuring more accurate color identification. Illumination of the surface 31 and the wires 18(1) . . . 18(8) can also be achieved by using a single lamp rather than the pair of lamps 32 and 34. However, the use of two lamps 32 and 34 helps to avoid uneven illumination.

Three black and white television cameras 40, 42 and 44 are each trained on the surface 31 to capture the image of the wires 18(1) . . . 18(8) as well as the image of that area on the surface not occupied by the wires. The cameras 40, 42 and 44 are each provided with a separate one of lenses 46, 48 and 50, respectively which have a separate one of band pass filters 52, 54 and 56, respectively, attached thereto. In practice, the band pass filters 52, 54 and 56 are each constructed to pass those spectral components in the incident light thereon having wavelengths centered about 6500, 5500 and 4500 Angstroms, respectively. In this way, the television cameras 40, 42 and 44 are made sensitive to the red, green and blue spectral components, respectively, in the light reflected from the surface 31 and from the wires 18(1) . . . 18(8). The television cameras 40, 42 and 44 are each coupled to a machine vision system 58 which, in an exemplary embodiment, comprises a model P-256 machine vision system manufactured by IRI Corp., Carlsbad, Calif. The vision system 58 has its output coupled to a television monitor 60.

To enable the system 28 to properly identify the color of the jacket 24 (see FIG. 1) of each of the wires 18(1) . . . 18(8), the system must be taught to recognize that color. In other words, the system 28 must be provided with a set of reference values representing each of the known wire colors so that a set of unknown wires 18(1) . . . 18(8) may be compared thereto. The system 28 is taught by viewing a set of wires 18(1) . . . 18(8), whose jacket colors are known. The image of the wires 18(1) . . . 18(8), as well as the image of the area on the surface 31 not occupied by the wires, is captured at the same time and within the same field of view by the television cameras 40, 42 and 44 whose output signal is supplied to the machine vision system 58. The machine vision system 58 digitizes the output signal of each of the television cameras 40, 42 and 44 by establishing a separate digital value for the intensity of each small picture element (pixel) within an n×m array of pixel elements comprising the image captured by each camera where n and m both typically equal 256. The digital values established by the vision system 58 for the intensity of the pixels within the image captured by the television camera 40 are represented by the elements $d(r)_{1,1} \ldots d(r)_{n,m}$ which comprise a first n×m matrix. Similarly, the digital values representing the intensity of the pixels within the images captured by the television cameras 42 and 44 are represented by the elements $d(g)_{1,1} \ldots d(g)_{n,m}$ and $d(b)_{1,1} \ldots d(b)_{n,m}$, respectively, which comprise each of two other n×m matrices. Since the television cameras 40, 42 and 44 are each sensitive to the red, green and blue light reflected from the surface 31 and the wires 18(1) . . . 18(8) placed thereon, the elements $d(r)_{1,1} \ldots d(r)_{n,m}$, $d(g)_{1,1} \ldots d(g)_{n,m}$, and $d(b)_{1,1} \ldots d(b)_{n,m}$ comprising the three matrices represent the red, green and blue pixel intensities, respectively.

In practice, each of the television cameras 40, 42 and 44 will produce an output signal of some finite magnitude, referred to as a dark current, when no light is incident thereon. The dark current of each of the cameras 40, 42 and 44 is much, much smaller than the output signal produced thereby when trained on the illuminated surface 31. Thus, it is generally not necessary to take the dark current of the cameras 40, 42 and 44 into account when processing the output signal thereof to determine the intensity of the image captured thereby.

Once the output signals of the television cameras 40, 42 and 44 have been digitized, the machine vision system 58 next selects the $c^{th}$ row of elements $d(r)_{c,1} \ldots d(r)_{c,m}$, $d(g)_{c,1} \ldots d(g)_{c,m}$, and $d(b)_{c,1} \ldots d(b)_{c,m}$ (where c−n) from each of the three previously established n×m matrices. $d(r)_{1,1} \ldots d(r)_{n,m}$, $d(g)_{1,1}d(r)_{n,m}$ and $d(b)_{1,1} \ldots d(b)_{n,m}$. The $c^{th}$ row of elements in each of the three n×m matrices represents the red, green and blue intensity, respectively, of the pixels lying within a strip 61 extending horizontally across the surface 31 at a right angle to the longitudinal axis of the wires 18(1) . . . 18(8). To facilitate the identification of the m pixels in the strip 61, the first of the m pixels is deemed to be located at the right-hand end thereof.

In practice, the location of each of the known colored wires 18(1) . . . 18(8) proximate to the surface 31 has been programmed into the machine vision system 58. Hence, the machine vision system 58 knows which of the elements $d(r)_{c,1} \ldots d(r)_{c,m}$, $d(g)_{c,1} \ldots d(g)_{c,m}$ and $d(b)_{c,1} \ldots d(b)_{c,m}$ in the $c^{th}$ row of each matrix is representative of the intensity of the red, green and blue spectral components, respectively, of the light reflected from each of the wires $18(1) \ldots 18(8)$. From this information, the machine vision system 58 establishes eight vectors $\hat{W}_1 \ldots \hat{W}_8$, each of the form $$\hat{W}_i = [w(r)_i \hat{r} + w(g)_i \hat{g} + w(b)_i \hat{b}] \tag{1}$$

where $w(r)_i$, $w(g)_i$, and $w(b)_i$ represent the intensity of the red, green and blue spectral components in the light reflected from the $i^{th}$ one of the wires $18(1) \ldots 18(8)$; and $\hat{r}$, $\hat{g}$ and $\hat{b}$ are each unit vectors lying along a separate one of three orthogonal axes As indicated previously, the machine vision system 58 knows where the wires $18(1) \ldots 18(8)$ are located. This information enables the machine vision system 58 to know which of the elements $d(c)_{c,1} \ldots d(r)_{c,m}$, $d(g)_{c,1} \ldots d(g)_{c,m}$ and $d(b)_{c,1} \ldots d(b)_{c,m}$ represents the red, green and blue intensity, respectively, of each wire. Knowing that, the machine vision system 58 can then establish the red, green and blue spectral intensities $I(r)$, $I(g)$ and $I(b)$, respectively, in the light reflected from an area on the surface 31 which is unobstructed by any of the wires $18(1) \ldots 18(8)$.

Once the machine vision system 58 has established each of the vectors $\hat{W}_1 \ldots \hat{W}_8$ and each of the values $I(r)$, $I(g)$ and $I(b)$, then eight new vectors $R\hat{E}F_1 \ldots R\hat{E}F_8$ are created, each taking the form $$R\hat{E}F_i = [c(r)_i \hat{r} + c(g)_i \hat{g} + c(b)_i \hat{b}] \tag{2}$$

where the components $c(r)_i$, $c(g)_i$, and $c(b)_i$ are given by $$c(r)_i = w(r)_i / I(r) \tag{3}$$

$$c(g)_i = w(g)_i / I(g) \tag{4}$$

$$c(b)_i = w(b)_i / I(b) \tag{5}$$

Figure 3:
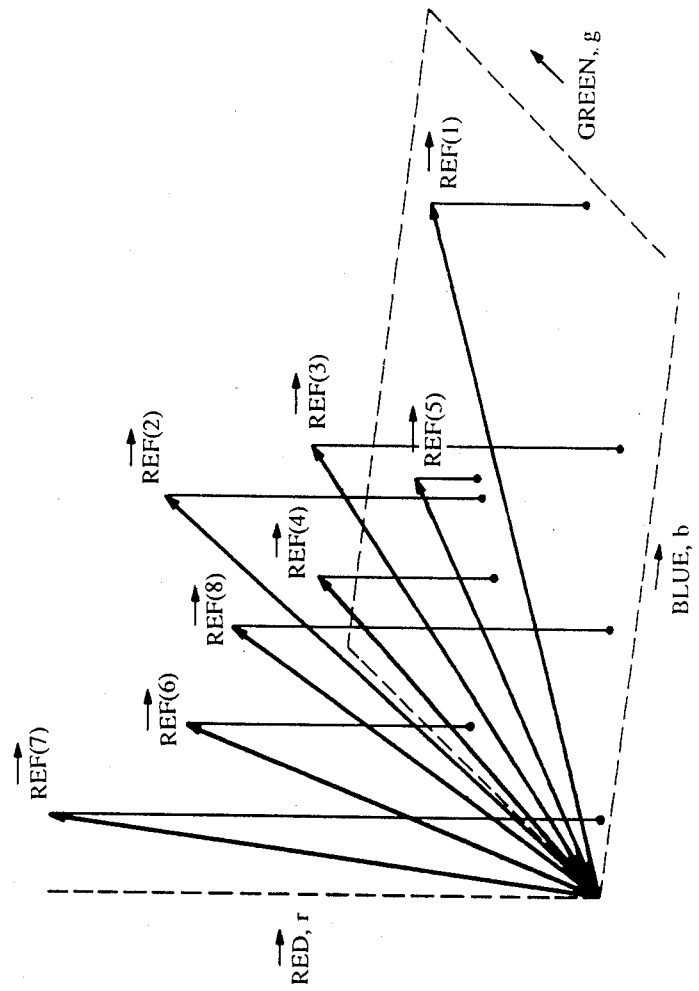
FIG. 3 is a graphical representation of a set of vectors, each representing the intensity of the red, green and blue spectral components in the light reflected from each wire in the cable of FIG. 1.

Referring to FIG. 3, the vectors $R\hat{E}F_1 \ldots R\hat{E}F_8$ are shown plotted along a set of orthogonal axes r, g, and b. As can be seen from FIG. 3, the vectors $R\hat{E}F_1 \ldots R\hat{E}F_8$ are unique since none are coincident. The fact that each of the vectors $R\hat{E}F_1 \ldots R\hat{E}F_8$ are unique permits the color of the jacket 24 (see FIG. 1) of each of the wires $18(1) \ldots 18(8)$ to be represented by a separate one of the vectors. Thus, the vectors $R\hat{E}F_1 \ldots R\hat{E}F_8$ can be used as a standard against which a set of vectors, each comprised of the red, green and blue spectral components in the light reflected from each of a set of wires $18(1) \ldots 18(8)$ of unknown color, are compared to achieve identification thereof.

Once the system 28 has been taught, that is, the vectors $R\hat{E}F_1 \ldots R\hat{E}F_8$ have been established, then a set of wires $18(1) \ldots 18(8)$ of unknown color sequence is placed proximate to the surface 31. Thereafter, the output signal of each of the television cameras 40, 42 and 44 is again digitized by the machine vision system 58 which establishes digital values for the red, green and blue intensity of the pixels within the image captured by the three cameras, respectively. The red, green and blue pixel intensity values associated with the image of the wires $18(1) \ldots 18(8)$ of unknown color and that of the surface 31 captured by the television cameras 40, 42 and 44 are represented by the elements $e(r)_{1,1} \ldots e(r)_{n,m}$, $e(g)_{1,1} \ldots e(g)_{n,m}$ and $e(b)_{1,1} \ldots e(b)_{n,m}$ which comprise three separate $n \times m$ matrices, respectively. As many be appreciated, a different designation has to be used to avoid confusion with the red, green and blue pixel intensity values associated with the image of the wires $18(1) \ldots 18(8)$ of known color.

In practice, the wires $18(1) \ldots 18(8)$ of unknown color sequence are randomly placed proximate to the surface 31. However, the wires $18(1) \ldots 18(8)$ are generally placed so as not to obstruct an area on the surface 31 whose location is known to the machine visio system 58. Thus, from the red, green and blue pixel intensity data represented by the elements $e(r)_{1,1} \ldots e(r)_{n,m}$, $e(g)_{1,1} \ldots e(g)_{n,m}$ and $e(b)_{1,1} \ldots e(b)_{n,m}$, respectively, the machine vision system 58 can determine the red, green and blue intensity $B(r)$, $B(g)$ and $B(b)$, respectively, of the light reflected from an area on the surface 31 unobstructed by the wires $18(1) \ldots 18(8)$ of unknown color.

The machine vision system 58 next selects the $c^{th}$ row of elements $e(r)_{c,1} \ldots e(r)_{c,m}$, $e(g)_{c,1} \ldots e(g)_{c,m}$, $e(b)_{c,1} \ldots e(b)_{c,m}$, from each of the three $n \times m$ matrices, $e(r)_{1,1} \ldots e(r)_{n,m}$, $e(g)_{1,1} \ldots e(g)_{n,m}$, and $e(b)_{1,1} \ldots e(b)_{n,m}$, respectively. Each of the $c^{th}$ row elements $e(r)_{c,1} \ldots e(r)_{c,m}$, $e(g)_{c,1} \ldots e(g)_{n,m}$ and $e(b)_{c,1} \ldots e(b)_{n,m}$ represents the red, green and blue spectral intensity, respectively, of each of the m pixels within the strip 61 extending across the surface 31 at right angles to each of the wires $18(1) \ldots 18(8)$ of unknown color. From the $c^{th}$ row of elements $e(r)_{c,1} \ldots e(r)_{c,m}$, $e(g)_{c,1} \ldots e(g)_{c,m}$, $e(b)_{c,1} \ldots e(b)_{c,m}$, in each of the three matrices, each set of vectors $\hat{U}_1 \ldots \hat{U}_m$ is derived, with each vector $U_i$ taking the form $$\hat{U}_i = [e(r)_{c,i}/B(r) \hat{r} + e(g)_{c,i}/B(g) \hat{g} + e(b)_{c,i}/B(b) \hat{b}] \tag{6}$$

Each vector $U_i$ is representative of the color of a separate one of the m pixels within the strip 61. There vectors $U_1 \ldots U_m$ each have the same form as the vectors $REF_1 \ldots REF_8$ which, as will be recalled, ar each uniquely associated with a separate one of the wires $18(1) \ldots 18(8)$ of known color. Thus, by finding the closest match between each of the vectors $U_1 \ldots U_m$ and a separate one of the vectors $REF_1 \ldots REF_8$, the color of those m pixels within the strip 61, which are not white, can be identified. Since the only pixels within the strip 61 which are not white are associated with a separate one of the wires $18(1) \ldots 18(8)$ of unknown color, these wires can thus be identified by matching the vectors $\hat{U}_1 \ldots \hat{U}_m$ with $R\hat{E}F_1 \ldots R\hat{E}F_m$.

A measure of the match between a pair of vectors $R\hat{E}F_i$ and $\hat{U}_i$, each having a magnitude $|REF_i|$ and $|U_i|$, respectively, is obtained by using the dot product function, defined mathematically by $$R\hat{E}F_i \cdot \hat{U}_i = |REF_i| |U_i| \cos \theta \tag{7}$$

where $\theta$ is the angle between the two vectors. As $\hat{U}_i$ approaches a match with $R\hat{E}F_i$, the dot product of $R\hat{E}F_i$ and $\hat{U}_i$ approaches the value $[|REF_i|]^2$. Since the cosine function is rather slowly varying around $\theta$ equal to zero where the best vector match-up occurs, it is more useful to obtain a more sensitive error function of the mismatch between the two vectors. A more sensitive error function $\Delta_i$ of the mismatch between the vector $R\hat{E}F_i$ and $\hat{U}_i$ can be derived from the dot product as follows:

$$\Delta_i = [(|REF_i| - |U_i|)^2 + \sin^2 \theta]^{\frac{1}{2}} \tag{8}$$

The smaller the value of $\Delta_i$, the greater the match between the vectors $\hat{REF}_i$ and $\hat{U}_i$.

To identify the wires 18(1) . . . 18(8) of unknown color sequence, the machine vision system 58 successively computes each of the error values $\Delta_1 \ldots \Delta_m$ between the vector $REF_1$ and each of the vectors $U_1 \ldots U_m$, respectively. Each successively computed error value $\Delta_i$ (which is referenced by the index variable, i), is only retained by the machine vision system 58, together with the value of i, if the magnitude of $\Delta_i$ is less than each of the preceding error values $\Delta_1 \ldots \Delta_j$ where $j < i$. Once all of the error values $\Delta_1 \ldots \Delta_m$ have been computed, the value of i ultimately retained serves to identify the particular one of the vectors $\hat{U}_1 \ldots \hat{U}_m$ which most closely matches $\hat{REF}_1$. The value of i which identifies the particular one of the vectors $U_1 \ldots U_m$ most closely matching the vector $REF_1$ is stored in a first of eight storage locations M1 . . . M8 within the machine vision system 58. As may be appreciated, the value of i stored in the memory location M1 corresponds to the identify (i.e., the number) of the pixel within strip 61 whose color substantially matches that represented by the vector $REF_1$.

The above-described process is repeated for each of the vectors $REF_2 \ldots REF_8$. The retained value of i which identifies the particular one of the vectors $U_1 \ldots U_m$ which most closely matches a successive one of the vectors $REF_2 \ldots REF_8$ is stored in a successive one of the memory locations M2 . . . M8. Once all of the memory locations M1 . . . M8 have been filled, the machine system 58 ranks the memory locations based on the ascending order of their contents. The particular one of the memory locations M1 . . . M8 ranked first contains the smallest value and thus is indicative of the number of the pixel within the strip 61 closest to the right-hand end thereof whose color substantially matches that associated with a particular one of the vectors $REF_1 \ldots REF_8$. The memory location ranked last contains the highest value which is indicative of the number of the pixel within the strip 61 furthest from the right-hand end thereof whose color substantially matches that associated with another of the vectors $REF_1 \ldots REF_8$.

By ranking the memory locations M1 . . . M8 in accordance with the contents thereof, the machine vison system 58 establishes the rank order of the location of those pixels within the strip 62 whose color substantially matches that associated with each of the vectors $REF_1 \ldots REF_8$. In other words, the machine vision system 58 locates the first, second, third, fourth, fifth, sixth, seventh and eighth one of the pixels within the strip 61 having a distinct color other than white. Since the only pixels within the strip 61 which have a color other than white correspond to a separate one of the wires 18(1) . . . 18(8) of unknown color, the color sequence of these eight pixels is exactly the same as the sequence of colors of the eight unknown wires. In this way, the machine vision system 58 can readily identify the individual color of each of the unknown wires 18(1) . . . 18(8). This information may be displayed on the monitor 60.

An advantage of the above-described color identification technique is that the accuracy thereof is not significantly affected by small variations in the intensity beams 36 and 38 or by small variations in the transmission characteristics of the filters 46, 48 and 50, due for example to dust thereon. It is true that such variations will affect the measurement made by the television cameras 40, 42 and 44 of the intensity of the red, green and blue spectral components, respectively, of the light reflected from both the surface 31 and from the wires 18(1) . . . 18(8). However, the ratio of the inensity of each of the red, green and blue spectral components of the light reflected from each of the wires 18(1) . . . 18(8) to the corresponding spectral component of the light reflected from the surface 31 has been found to remain substantially constant notwithstanding small variations in the output signals of the cameras 40, 42 and 44.

The following example will demonstrate that the accuracy of the instant color identification technique is not significantly affected by small variations of the type described above. Assume that the red, green and blue pixel intensities of the $m^{th}$ one of the pixels in the strip 61 are found to be 55, 62 and 46, respectively, when wires 18(1) . . . 18(8) of unknown color are placed against the surface 31. Further assume that the red, green and blue intensities B(r), B(g) and B(b) of the light reflected from an area on the surface 31 unobstructed by the wires 18(1) . . . 18(8) of unknown color are 147, 121, and 111, respectively. Thus, the vector $\hat{U}_m$ will be given by $$\hat{U}_m = (55/147\hat{r} + 62/121\hat{g} + 46/111\hat{b}) \tag{9}$$

and its magnitude $|U_m|$ will equal 0.7578.

If the intensity of each of the beams 36 and 38 of FIG. 3 were to decrease in intensity by 10%, then the red, green and blue intensity of the $m^{th}$ pixel in the strip 61 would drop by 10% as would the red, green and blue background intensities B(r), B(g) and B(b). The resultant vector $\hat{U}_m$ will now be given by $$\hat{U}_m = (49/132\hat{r} + 56/109\hat{g} + 41/100\hat{g}) \tag{10}$$

with its magnitude $|U_m|$ being equal to 0.7549.

As may now be appreciated, the magnitude of the vector $\hat{U}_m$ remains substantially the same as before, notwithstanding a 10% change in the illumination. Not only does the magnitude of the vector $\hat{U}_m$ remain substantially the same, its direction also remains substantially the same. This is because the ratios of red, green and blue intensity of the $m^{th}$ pixel within the strip 61 to the background intensities B(r), B(g) and B(b), respectively, remain about the same.

The instant color identification technique is more robust than prior art techniques which rely only on the intensity of the spectral components in light reflected from an object to be identified. Moreover, the instant technique does not require that any feedback mechanism be provided to control the illumination of the object to be identified.

Figure 4:
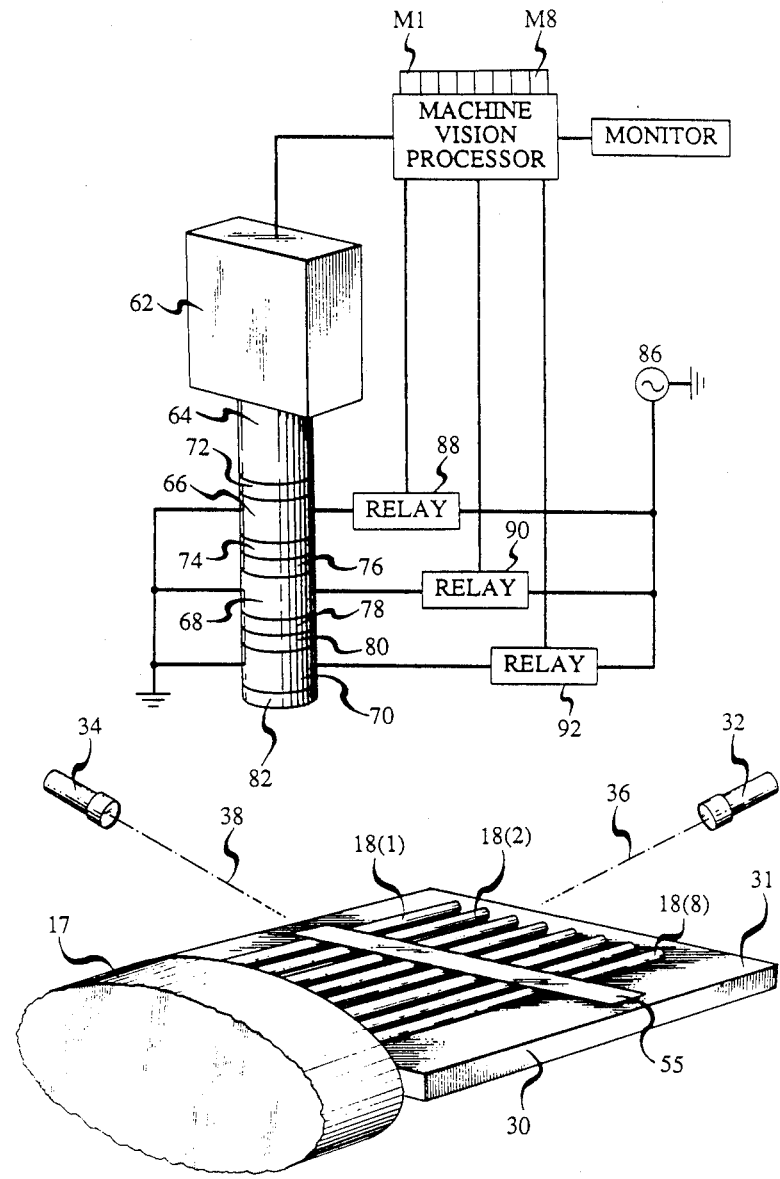
FIG. 4 is a schematic view of an alternate preferred embodiment of a color identification apparatus.

FIG. 4 shows a modification of the color identification system 28 of FIG. 2. Like reference numerals in FIG. 4 have been used as in FIG. 2 to reference like elements. The color identification system 28 of FIG. 4 utilizes a single black and white television camera 62 rather than the three separate television cameras 40, 42 and 44 shown in FIG. 2. The television camera 62 of FIG. 4 carries a lens 64 which mounts three light valves 66, 68 and 70, superimposed on each other for polarizing the light received by the camera when each light valve is electrically energized. Each of the light valves 66, 68 and 70 has each of a pair of polarizers 72, 74, 76 and 78 and 80 and 82, respectively, attached to an opposite one of the faces thereof such that the axis of polarization of each polarizer is at right angles to that of the associated light valve. The polarizer pairs 72 and 74, 76 and 78, and 80 and 82, are designed to polarize all but red, green and blue light, respectively. In an exemplary embodiment, the light valves 66, 68 and 70, and the polarizers 72, 74, 76, 78, 80 and 82, were obtained from U.C.E. Inc., Norwalk, Conn.

Each of the light valves 66, 68 and 70 is coupled to a signal source 86 through a separate one of a set of relays 88, 90 and 92, respectively, each controlled by the machine vision system 58. Each of the relays 88, 90 and 92 is normally open, and therefore, each of the light valves 66, 68 and 70 is normally de-energized. While de-energized, each of the light valves 66, 68 and 70 passes light of all wavelengths therethrough. When each of the relays 88, 90 and 92 is closed by the machine vision system 58, the corresponding one of the light valves 66, 68 and 70 is energized and thus serves to polarize the light passing therethrough.

As indicated, each of the pairs of polarizers 72 and 74, 76 and 78, and 80 and 82 have their axis of polarization at right angles to that of the corresponding one of the light valves 66, 68 and 70, respectively. Thus, when each of the light valves 66, 68 and 70 is energized, all but the red, green and blue spectral components, respectively, of the light incident on the light valve will be blocked thereby. Thus, while a separate one of the three light valves 66, 68 and 70 is energized, the television camera 56 will only sense the red, geen and blue spectral components, respectively, of the light reflected from the surface 31 and the wires 18(1) . . . 18(8).

The color identification system 28 of FIG. 4 operates in basically the same manner as the system of FIG. 2. The difference is that the machine vision system 58 of FIG. 4 will receive the data from the television camera 62 indicative of the intensity of the red, green and blue spectral components of the light reflected from the surface 31 and from the wires 18(1) . . . 18(8) placed proximate thereto when the relays 88, 90 and 92, respectively, are successively closed. The red, green and blue spectral component intensity data are processed by the machine vision system 58 in the same manner as described previously to establish the color identity of the wires 18(1) . . . 18(8).

Figure 5:
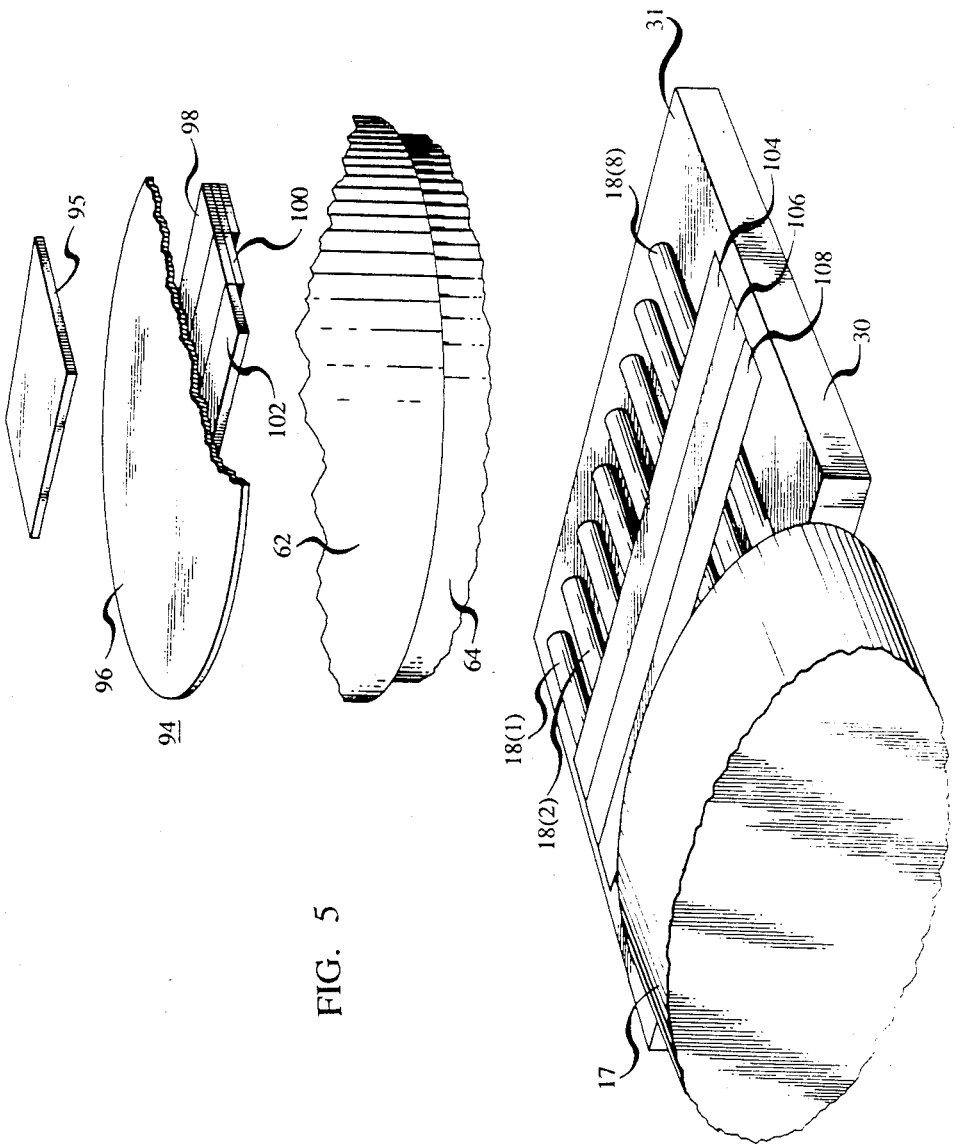
FIG. 5 is a partial schematic view of the color identification system of FIG. 4, as modified to include a stripe filter.

The color identification system 28 of FIG. 4 can be modified by deleting the light valves 66, 68 and 70 and polarizers 72, 74, 76, 78, 80 and 82 and instead, placing a stripe filter 94, of the type shown in FIG. 5, within the camera 62 so as to be just ahead of the image plane thereof at which a charge coupled device sensing element 95 is located. As seen in FIG. 5, the stripe filter 94 comprises a transparent base plate 96 which carries three sets of Wratten gel strips 98, 100 and 102 spaced alongside each other. The strips within each of the sets 98, 100 and 102 only pass red, green and blue light, respectively. In an exemplary embodiment, the strips of each of the sets 98, 100 and 102 were cut from a separate one of Kodak Wratten gel Filters #92 (deep red), #57 (green) and #47 (blue), respectively, all available, from Eastman Kodak Co., Rochester, N.Y. The number of strips within each of the sets 98, 100 and 102 is selected so that the color density of the strip sets is equal. Rather than construct the stripe filter 94 by affixing the Wratten gelatin strip sets 98, 100 and 102 to the baseplate 96, the filter could also be constructed by depositing three stripes of material on the baseplate or on the sensing element 95, which would then pass only red, green and blue light, respectively, therethrough.

Placing the stripe filter 94 proximate the sensing element 95 of the television camera 62 will render the camera sensitive to the red, green and blue spectral components of the light reflected from each of three separate bands 104, 106 and 108, respectively, extending across the surface 31 on the substrate 30 at right angles to the wires 18(1) . . . 18(8). When supplied with the output signal of the camera 62, the machine vision system 58 can determine the red, green and blue intensity of the pixels within the image of each of the bands 104, 106 and 108, respectively.

In practice, the strip sets 98, 100 and 102 of the strip filter 94 are very narrow (typically 0.025 inches wide) and thus, each of the bands 104, 106, and 108 appears very narrow to the television camera 64. Because the bands 104, 106 and 108 appear very narrow, the corresponding pixels within the images of the bands have substantially the same red, green and blue intensity. This information enables the machine vision system 58 to process the data representative of the red, green and blue pixel intensities to establish the vectors $REF_1$ . . . $REF_8$ and $U_1$ . . . $U_m$ when the wires 18(1) . . . 18(8) of known and unknown color, respectively, are placed proximate to the surface 31. Once the vectors $REF_1$ . . . $REF_8$ and $U_1$ . . . $U_m$ have been established, the wires 18(1) . . . 18(8) of unknown color can be identified in the manner described above.

It is to be understood that the embodiments described herein are merely illustrative of the principles of the invention. Various modifications and changes may be made thereto by persons skilled in the art which will embody the principles of the invention and fall within the spirit and scope thereof. For example, while the present invention has been described specifically with respect to identifying the color of the wires 18(1) . . . 18(8), it may readily be employed to identify the color of many other types of objects as well.

What is claimed is:

1. A method of fabricating an article comprising the steps of:

identifying the color of an object by illuminating the object, sensing the intensity of each of a plurality of spectral components in the light reflected from the object, and comparing the intensity values to each of a standard set of intensity values associated with each of a plurality of known colors; and completing the fabrication of said article in accordance with the color of said object, characterized in that said identifying step further includes the steps of:

placing the object proximate to a background which is of a color uniquely distinguishable from the possible colors of said object;

illuminating said background simultaneously with said object;

sensing each of said plurality of spectral components in the light reflected from said background, simultaneously with sensing the spectral components in the light reflected from the object;

computing the ratio of the intensity of each spectral component of the light reflected from said object to the corresponding spectral component of the light reflected from said background; and comparing the computed intensity ratios to each of a set of intensity ratios established for each of a set of reference bodies of different known colors placed proximate to said background until a substantial match is found between each of the computed intensity ratios and each of the intensity ratios of a set associated with a reference body having a particular color.

2. The method according to claim 1, characterized in that said sensing step comprises the step of sensing the intensity of the red, green ad blue spectral components in the light reflected from said object and of the light reflected from said background.

3. The method according to claim 2, characterized in that said sensing step includes the step of filtering the light incident on each of three separate sensing means to each senses the red, green and blue light, respectively, reflected from said object and said background simultaneously.

4. The method according to claim 2, characterized in that said sensing step includes the step of sequentially filtering the light incident on a single light-sensing means so said sensing means successively senses the red, green and blue light reflected from said object and said background.

5. The method according to claim 2, characterized in that said sensing step includes the step of spatially filtering the light incident on a single sensing means so said sensing means senses the red, green and blue light reflected from three spatially separated areas, respectively, on said object and said background.

6. The method according to claim 1, characterized in that said set of intensity ratios associated with each said reference body is established by a method comprising the steps of:
  placing each said reference body proximate to the background;
  simultaneously illuminating said background and said reference body placed proximate thereto;
  sensing the intensity of each of a plurality of spectral components in the light reflected from said reference body simultaneously with the corresponding spectral components in the light reflected from said background; and
  computing the ratio of the intensity of each of said spectral components in the light reflected from said reference body to the corresponding spectral component in the light reflected from said background.

7. The method according to claim 1, characterized in that said object to be identified comprises a wire formed of an electrical conductor sheathed by a colored insulative jacket.

8. Apparatus for identifying the color of an object comprising:
  a background proximate to which said object is placed, said background being of a color which is uniquely distinguishable from the possible colors of said object;
  means for simultaneously illuminating said background and object placed proximate thereto; and
  means for sensing the intensity of each of a plurality of spectral components of the light reflected from said object and of the light reflected from said background, characterized in that said apparatus further includes:
  means for computing the ratio of the intensity of each spectral component of the light reflected from said object to the corresponding spectral component of the light reflected from said background; and
  means for comparing each of the computed ratios to each of a set of intensity ratios associated with a separate one of a plurality of reference bodies of different known colors until a substantial match is found between one of the computed intensity ratios and each of the intensity ratios within the set associated with the reference body of a particular color.

9. The apparatus according to claim 8, characterized in that said sensing means comprises three television cameras, each having a band pass filter thereon for passing only the red, green and blue spectral components, respectively, of the light reflected from said object and of the light reflected from said surface.

10. The apparatus according to claim 8, characterized in that said sensing means comprises a single television camera having each of three light filtering means superimposed thereon for selectively passing only red, green and blue light, respectively.

11. The apparatus according to claim 8, characterized in that said sensing means comprises a single television camera having a stripe filter thereon for passing only red, green and blue light reflected from three separate areas on said background.

12. The apparatus according to claim 8, characterized in that said computing means and said comparing means are jointly comprised of a machine vision system.

* * * * *